(12) United States Patent
Ausserlechner et al.

(10) Patent No.: US 11,067,378 B2
(45) Date of Patent: Jul. 20, 2021

(54) EXTERNAL FIELD ROBUST ANGLE SENSING WITH DIFFERENTIAL MAGNETIC FIELD

(71) Applicant: Infineon Technologies AG, Neubiberg (DE)

(72) Inventors: Udo Ausserlechner, Villach (AT); Wolfgang Granig, Seeboden (AT)

(73) Assignee: Infineon Technologies AG

( * ) Notice: Subject to any disclaimer, the term of this patent is extended or adjusted under 35 U.S.C. 154(b) by 0 days.

(21) Appl. No.: 16/778,782

(22) Filed: Jan. 31, 2020

(65) Prior Publication Data

US 2020/0166326 A1 May 28, 2020

Related U.S. Application Data

(63) Continuation of application No. 16/294,305, filed on Mar. 6, 2019, now Pat. No. 10,591,274, which is a (Continued)

(30) Foreign Application Priority Data

Sep. 28, 2016 (DE) ...................... 10 2016 118 384.9

(51) Int. Cl.
*G01B 7/30* (2006.01)
*G01B 7/00* (2006.01)
(Continued)

(52) U.S. Cl.
CPC .............. *G01B 7/30* (2013.01); *G01B 7/003* (2013.01); *G01D 5/142* (2013.01); *G01D 5/145* (2013.01); *G01D 5/16* (2013.01); *G01R 33/09* (2013.01)

(58) Field of Classification Search
CPC .......... G01B 7/003; G01B 7/30; G01D 5/145; G01D 5/147; G01D 5/165; G01R 33/02; G01R 33/025; G01R 33/093
(Continued)

(56) References Cited

U.S. PATENT DOCUMENTS

| 5,198,762 A | 3/1993 | Shimoe et al. |
| 6,288,533 B1 * | 9/2001 | Haeberli ................ A61K 48/00 |
| | | 324/207.12 |

(Continued)

FOREIGN PATENT DOCUMENTS

| CN | M3241064 U | 10/2013 |
| CN | 103443590 A | 12/2013 |

(Continued)

*Primary Examiner* — Steven L Yeninas
(74) *Attorney, Agent, or Firm* — Design IP

(57) ABSTRACT

A magnetic angle sensor device and a method for operating such device is provided. The magnetic angle sensor device includes a shaft rotatable around a rotation axis; a magnetic arrangement coupled to the shaft, where the magnetic arrangement produces a differential magnetic field comprising a plurality of diametric magnetic fields; a first magnetic angle sensor provided in the differential magnetic field and configured to generate a first signal that represents a first angle based on a first diametric magnetic field of the differential magnetic field; a second magnetic angle sensor provided in the differential magnetic field and configured to generate a second signal that represents a second angle based on a second diametric magnetic field of the differential magnetic field; and a combining circuit configured to determine a combined rotation angle based on the first signal and on the second signal.

8 Claims, 11 Drawing Sheets

Related U.S. Application Data continuation-in-part of application No. 15/713,877, filed on Sep. 25, 2017, now Pat. No. 10,578,419.

(51) Int. Cl.
  *G01D 5/14* (2006.01)
  *G01D 5/16* (2006.01)
  *G01R 33/09* (2006.01)

(58) Field of Classification Search
  USPC .......................... 324/207.12, 207.13, 207.25
  See application file for complete search history.

(56) References Cited

U.S. PATENT DOCUMENTS

| | | | |
|---|---|---|---|
| 9,024,626 B2 | 5/2015 | Kotani et al. | |
| 9,379,598 B2 | 6/2016 | Someya et al. | |
| 9,618,365 B2 | 4/2017 | Ausserlechner et al. | |
| 10,533,877 B2 | 1/2020 | Zimmer | |
| 2001/0033231 A1* | 10/2001 | Matsui | G01D 5/145 340/672 |
| 2004/0160220 A1 | 8/2004 | Wendt | |
| 2004/0239313 A1* | 12/2004 | Godkin | G01D 5/145 324/207.2 |
| 2005/0253578 A1* | 11/2005 | Kawashima | G01D 5/24419 324/207.25 |
| 2009/0315547 A1* | 12/2009 | Abwa | G01R 33/02 324/244 |
| 2010/0050731 A1* | 3/2010 | Granig | G01P 21/02 73/1.11 |
| 2012/0038351 A1* | 2/2012 | Saruki | G01D 5/145 324/207.25 |
| 2012/0038359 A1* | 2/2012 | Saruki | G01R 33/093 324/252 |
| 2012/0176126 A1* | 7/2012 | Naganuma | G01D 5/145 324/207.25 |
| 2014/0285188 A1 | 9/2014 | Kuwano | |
| 2015/0025761 A1* | 1/2015 | Kernebeck | F16H 59/105 701/60 |
| 2015/0066426 A1 | 3/2015 | Hirota et al. | |
| 2015/0192432 A1* | 7/2015 | Noguchi | G01R 33/09 324/207.2 |
| 2015/0219472 A1* | 8/2015 | Ausserlechner | G01D 5/12 324/207.25 |
| 2015/0226581 A1* | 8/2015 | Schott | G01D 5/145 324/207.2 |
| 2015/0276893 A1 | 10/2015 | Kaufmann et al. | |
| 2015/0377648 A1 | 12/2015 | Sirohiwala et al. | |
| 2020/0049528 A1 | 2/2020 | Ausserlechner | |
| 2020/0166326 A1 | 5/2020 | Ausserlechner et al. | |
| 2021/0080516 A1 | 3/2021 | Ausserlechner et al. | |

FOREIGN PATENT DOCUMENTS

| | | |
|---|---|---|
| CN | 105387876 A | 3/2016 |
| CN | 107121057 A | 9/2017 |
| CN | 107450035 A | 12/2017 |
| CN | 107869951 A | 4/2018 |
| CN | 108489379 A | 9/2018 |

* cited by examiner

EXTERNAL FIELD ROBUST ANGLE SENSING WITH DIFFERENTIAL MAGNETIC FIELD

CROSS-REFERENCE TO RELATED APPLICATIONS

This application is a continuation of U.S. patent application Ser. No. 16/294,305 filed Mar. 6, 2019, which is a continuation-in-part of U.S. patent application Ser. No. 15/713,877, filed Sep. 25, 2017, which claims the benefit of German Patent Application No. 10 2016 118 384.9 filed Sep. 28, 2016, which are incorporated by reference as if fully set forth.

FIELD

The present disclosure relates generally to a magnetic angle sensor arrangement, and more particularly, to a magnetic angle sensor device configured to determine a rotational position or movement of a shaft and a method of operation.

BACKGROUND

A magnetic angle sensor may be used to detect a rotational position or movement of a shaft. Typically, a permanent magnet is attached to a rotatable shaft and a single magnetic field sensor is placed on the rotation axis and adjacent to the magnet.

A disadvantage of known solutions is that they are very sensitive to magnetic disturbances. For example, if the magnet generates a field of, e.g., 45 mT at the sensor elements, a magnetic disturbance amounting to, e.g., 3 mT (in a worst case direction perpendicular to the axis and orthogonal to the field of the magnet) leads to an error amounting to 3.8° (arctan(3/45)=3.8°), which is generally not acceptable.

Magnetic disturbance fields are prevalent in vehicles such that magnetic angle-measurements often have to endure harsh environments. This is especially problematic in new hybrid and electric vehicles, where many wires with high currents are located near the sensor system. Thus, external magnetic disturbance fields may be generated by current-rails in a vehicle that influence the accuracy of the magnetic angle measurements.

SUMMARY

Embodiments provided herein relate to a magnetic angle sensor arrangement that determines a rotational position or movement of a shaft.

According to one or more embodiments, a magnetic angle sensor device includes a shaft rotatable around a rotation axis; a magnetic arrangement coupled to the shaft, where the magnetic arrangement produces a differential magnetic field comprising a plurality of diametric magnetic fields; a first magnetic angle sensor provided in the differential magnetic field and configured to generate a first signal that represents a first angle based on a first diametric magnetic field of the differential magnetic field; a second magnetic angle sensor provided in the differential magnetic field and configured to generate a second signal that represents a second angle based on a second diametric magnetic field of the differential magnetic field; and a combining circuit configured to determine a combined rotation angle based on the first signal and on the second signal.

According to one or more embodiments, a method is provided for determining a combined rotation angle of a shaft using a magnetic arrangement that produces a differential magnetic field including a plurality of diametric magnetic fields. The method includes generating, by a first magnetic angle sensor provided in the differential magnetic field, a first signal that represents a first angle based on a first diametric magnetic field of the differential magnetic field applied to the first magnetic angle sensor; generating, by a second magnetic angle sensor provided in the differential magnetic field, a second signal that represents a second angle based on a second diametric magnetic field of the differential magnetic field applied to the second magnetic angle sensor; and determining the combined rotation angle based on the first signal and on the second signal.

According to one or more embodiments, a computer program product directly loadable into a memory of a digital processing device, including software code portions that enable the digital processing device to perform one or more methods described herein.

According to one or more embodiments, a computer-readable medium, e.g., non-transitory storage of any kind, is provided having computer-executable instructions adapted to cause a computer system to perform one or more methods described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Examples described herein in particular refer to magnetic angle sensors, where a permanent magnet is attached to a rotatable shaft and a magnetic field sensor is placed on the rotation axis and adjacent to the magnet. The magnetic angle sensor detects the rotatable magnetic field, which points in diametric direction, and therefrom it infers the rotational position of the shaft.

Various sensors can be used, e.g., an anisotropic magneto-resistor (AMR), a giant magneto-resistor (GMR), a tunneling magneto-resistor (TMR), Hall-effect devices (e.g., Hall plates, vertical Hall-effect devices) or magnetic field-effect transistor (MAG-FET) (e.g., split-drain MAG-FETs).

The embodiments provided herein use several angle sensors and combine their outputs to derive an angle estimation which is robust against external disturbance fields.

This may be beneficial in harsh environments such as in a vehicle or car, where external magnetic fields generated by current-rails in the vehicle influence the accuracy of the magnetic angle measurement. This becomes particularly problematic in hybrid or electric cars which comprise a multitude of wires carrying high currents adjacent to or in the vicinity of the sensor system.

Figure 1:
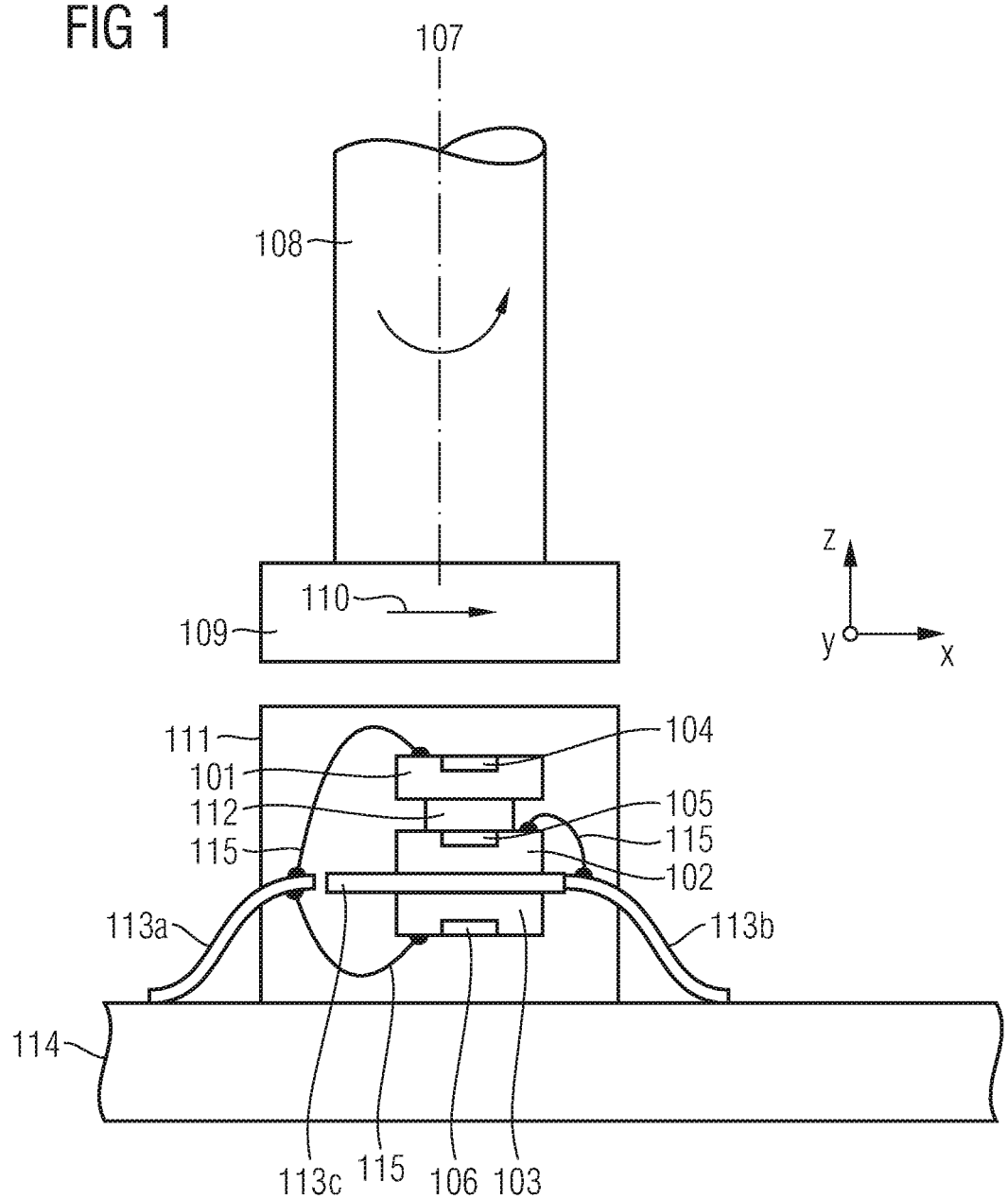
FIG. 1 shows an example embodiment of a sensor system including a shaft that rotates around a rotation axis, where a magnet is attached to the shaft and rotates above three magnetic angle sensors that are arranged on the rotation axis.

FIG. 1 shows an example embodiment of a sensor system including a shaft that rotates around a rotation axis, where a magnet is attached to the shaft and rotates above three magnetic angle sensors that are arranged on the rotation axis.

Figure 2:
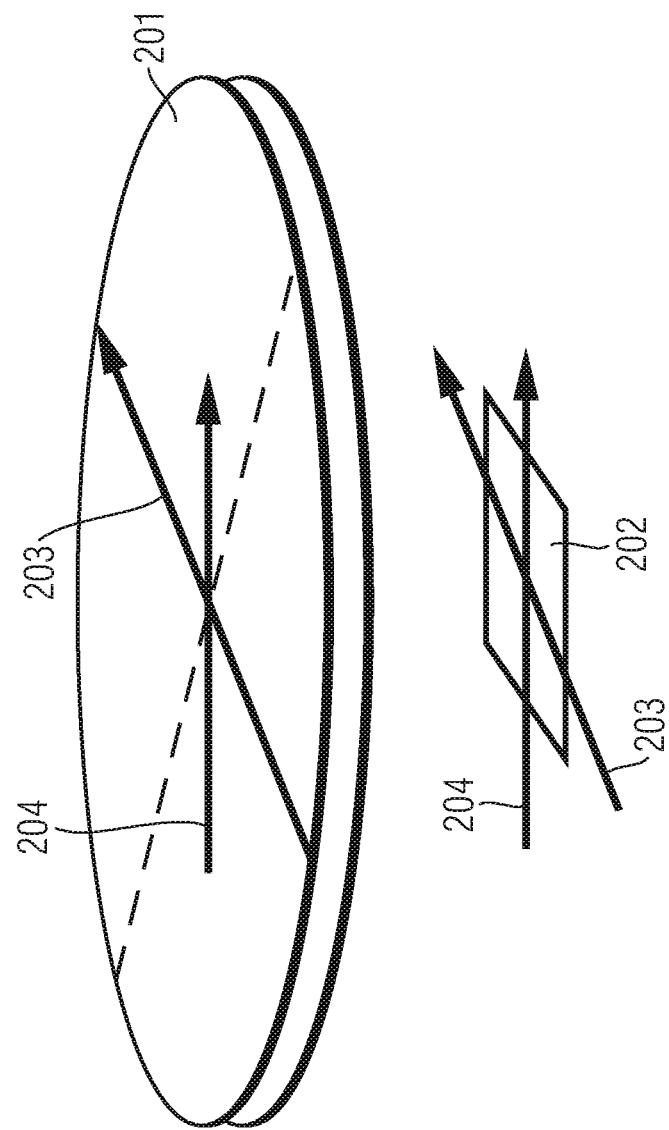
FIG. 2 shows a schematic diagram comprising a diametrically magnetized magnet and a magnetic angle sensor showing a magnetic target field vector and a disturbance field vector.

FIG. 2 shows a schematic diagram comprising a diametrically magnetized magnet and a magnetic angle sensor showing a magnetic target field vector and a disturbance field vector. Specifically, FIG. 2 shows a schematic diagram comprising a diametrically magnetized magnet 201 and a magnetic angle sensor 202. The magnet 201 has a magnetic target field vector 203; also, a disturbance field vector 204 is present. The disturbance field vector 204 superimposes with the target field vector 203 of the magnet 201 and generates an angle error on the magnetic angle sensor 202.

FIG. 1 shows an example arrangement comprising a shaft 108 that rotates around a rotation axis 107. A magnet 109 is attached to the bottom of the shaft 108, wherein the magnet has a magnetization 110 in x-direction. Three angle sensors 101, 102 and 103 are arranged within a mold body 111, which is arranged below the magnet 109. The distance between the magnet 109 and the mold body 111 may be in a range between 1 mm and 3 mm. Each of the angle sensors 101 to 103 comprises a sensor element 104 to 106. The angle sensors 101 to 103 are electrically connected to leads 113a, 113b via bond wires 115, where the mold body 111 is connected via the leads 113a, 113b to a printed circuit board 114.

The magnetic angle sensors 101 to 103 are of a "perpendicular angle sensor" type, which means that they respond to the rotation angle of the shaft, where the magnetic field component affects a sensing surface of the respective angle sensor that is perpendicular to the rotation axis. They are arranged stacked to each other, so that the gravity centers of their sensor elements 104 to 106 are substantially located on the rotation axis 107 and they are at three different distances from the magnet 109 (i.e. at different z-positions). The angle sensor 101 and the angle sensor 102 are separated by a distance element 112, wherein the angle sensor 102 is located on top of a die paddle 113c. The angle sensor 103 is mounted below the die paddle 113c, wherein the sensor elements 105, 106 are arranged on opposite sides of the angle sensors 102, 103.

The angle sensor 101 detects an angle $\varphi_1$. The sensor element 104 of the angle sensor 101 is at an axial position $z_1$.

The angle sensor 102 detects an angle $\varphi_2$. The sensor element 105 of the angle sensor 102 is at an axial position $z_2$.

The angle sensor 103 detects an angle $\varphi_3$. The sensor element 106 of the angle sensor 103 is at an axial position $z_3$.

It is noted that each of the angle sensors 101 to 103 may comprise at least one sensor element 104 to 106.

It is noted that each angle sensor may comprise two vertical Hall devices (also referred to as vertical Hall effect devices). In an example embodiment, a first vertical Hall device is oriented such that it merely detects magnetic field components in a first direction (e.g., in x-direction, whereas magnetic field components in y- and z-direction are not detected by the first vertical Hall device). A second vertical Hall device is oriented such that it merely detects magnetic field components in a second direction, which is different from the first direction (e.g., in y-direction, whereas magnetic field components in x- and z-direction are not detected by the second vertical Hall device). The angle sensor determines a signal which corresponds to the arctan of the magnetic fields $B_x$ and $B_y$, i.e. $\arctan_2 (B_x, B_y)$. This is equivalent to the angle between the magnetic field with a vanishing $B_z$-component and a positive x-axis. If the $B_z$-component of the magnetic field is set to zero, a projection of the magnetic field perpendicular to the rotation axis can be obtained, which is parallel to the z-axis. This projection is also called a diametric magnetic field.

It is an option that each angle sensor may comprise two Wheatstone bridges of magneto-resistive resistors. One bridge provides a signal that is proportional to the sine of an angle between the diametric magnetic field and the x-axis. The other bridge provides a signal that is proportional to the cosine of this angle. The angle sensor may thus provide the signal that corresponds to the arctan of this sine and cosine, i.e. $\arctan_2$ (cos, sin).

Each bridge comprises four resistors in an Wheatstone bridge arrangement. In case GMRs or TMRs are used, the resistors of the main diagonal of the sine bridge comprise a pinned layer, which is magnetized in a positive y-direction. The resistors of the secondary diagonal of the sine bridge comprise a pinned layer, which is magnetized in a negative y-direction. The resistors of the main diagonal of the cosine bridge comprise a pinned layer, which is magnetized in a positive x-direction and the resistors of the secondary diagonal of the cosine bridge comprise a pinned layer, which is magnetized in a negative x-direction.

In case AMR sensors are used, the signals of the bridges are proportional to $\cos(2\varphi)$ and $\sin(2\varphi)$ with $\varphi$ being the angle between the diametric magnetic field component and the positive x-axis. The resistors of the cosine bridge show a current flow in x-direction along the main diagonal and a current flow in y-direction along the secondary diagonal (positive or negative does not matter in this case). The resistors of the sine bridge show a current flow in x-direction plus 45 degrees (clock-wise) along the main diagonal and a current flow in x-direction minus 45 degrees (counter-clockwise) along the secondary diagonal.

A diametric magnetic field on the rotation axis 107 at the axial position $z_1$ which is generated by the rotatable magnet 109 amounts to $B_1$, which comprises the components $B_{x1}$ and $B_{y1}$ (the $B_z$-component is irrelevant). It is noted that "diametric" means a projection of the magnetic field vector on the x-y-plane, i.e. a field vector with no or no significant z-portion.

A diametric magnetic field on the rotation axis 107 at the axial position $z_2$ which is generated by the rotatable magnet 109 amounts to $k_2 \cdot B_1$, which comprises the components $k_2 \cdot B_{x1}$ and $k_2 \cdot B_{y1}$ (the $B_z$-component is irrelevant).

The diametric magnetic field on the rotation axis 107 at the axial position $z_3$ which is generated by the rotatable magnet 109 amounts to $k_3 \cdot B_1$, which comprises the components $k_3 \cdot B_{x1}$ and $k_3 \cdot B_{y1}$ (the $B_z$-component is irrelevant).

Further, a homogeneous disturbance field Bd may be present comprising the components $Bd_x$ and $Bd_y$ (the $B_z$-component is irrelevant).

The following applies:

$$\tan\varphi_1 = \frac{B_{y1} + Bd_y}{B_{x1} + Bd_x} \qquad \text{eq. (1)}$$

$$\tan\varphi_2 = \frac{k_2 \cdot B_{y1} + Bd_y}{k_2 \cdot B_{x1} + Bd_x} \qquad \text{eq. (2)}$$

$$\tan\varphi_3 = \frac{k_3 \cdot B_{y1} + Bd_y}{k_3 \cdot B_{x1} + Bd_x} \qquad \text{eq. (3)}$$

Hence, the rotational position $\varphi 0$ of the shaft 108 amounts to:

$$\tan\varphi_0 = \frac{B_{y1}}{B_{x1}} \qquad \text{eq. (4)}$$

Multiplying equation (1) with $(Bx1+Bdx)$ leads to:

$$(B_{x1}+Bd_x)\cdot\tan\varphi_1 = B_{y1}+Bd_y; \qquad \text{eq. (5)}$$

Multiplying equation (2) with $(k_2 \cdot B_{x1}+Bd_x)$ leads to:

$$(k_2 \cdot B_{x1}+Bd_x)\cdot\tan\varphi_2 = k_2 \cdot B_{y1}+Bd_y; \qquad \text{eq. (6)}$$

Multiplying equation (3) with $(k_3 \cdot B_{x1}+Bd_x)$ leads to:

$$(k_3 \cdot B_{x1}+Bd_x)\cdot\tan\varphi_3 = k_3 \cdot B_{y1}+Bd_y. \qquad \text{eq. (7)}$$

Subtracting equations (5) to (6) result in:

$$(B_{x1}+Bd_x)\cdot\tan\varphi_1 - (k_2 \cdot B_{x1}+Bd_x)\cdot\tan\varphi_2 = B_{y1}-k_2 \cdot B_{y1}. \qquad \text{eq. (8)}$$

Subtracting equations (5) to (7) result in:

$$(B_{x1}+Bd_x)\cdot\tan\varphi_1 - (k_3 \cdot B_{x1}+Bd_x)\cdot\tan\varphi_3 = B_{y1}-k_3 \cdot B_{y1}. \qquad \text{eq. (9)}$$

Equation (4) can be converted to:

$$B_{y1}=B_{x1}\cdot\tan\varphi_0$$

which allows replacing By1 in equations (8) and (9) leading to:

$$(B_{x1}+Bd_x)\cdot\tan\varphi_1-(k_2 \cdot B_{x1}+Bd_x)\cdot\tan\varphi_2=(1-k_2)\cdot B_{x1}\cdot\tan\varphi_0; \qquad \text{eq. (10)}$$

$$(B_{x1}+Bd_x)\cdot\tan\varphi_1-(k_3 \cdot B_{x1}+Bd_x)\cdot\tan\varphi_3=(1-k_3)\cdot B_{x1}\cdot\tan\varphi_0; \qquad \text{eq. (11)}$$

Separating Bdx at the left hand side of equations (10) and (11) leads to:

$$Bd_x(\tan\varphi_1-\tan\varphi_2)=(1-k_2)B_{x1}\tan\varphi_0-B_{x1}\tan\varphi_1+k_2 B_{x1}\tan\varphi_2; \qquad \text{eq. (12)}$$

$$Bd_x(\tan\varphi_1-\tan\varphi_3)=(1-k_3)B_{x1}\tan\varphi_0-B_{x1}\tan\varphi_1+k_3 B_{x1}\tan\varphi_3; \qquad \text{eq. (13)}$$

A division of equations (12)/(13) and solving the result for $\tan\varphi 0$ leads to:

$$\tan\varphi_0 = \frac{((\tan\varphi_1-\tan\varphi_3)(k_2\tan\varphi_2-\tan\varphi_1)-(\tan\varphi_1-\tan\varphi_2)(k_3\tan\varphi_3-\tan\varphi_1))}{((1-k_3)(\tan\varphi_1-\tan\varphi_2)-(1-k_2)(\tan\varphi_1-\tan\varphi_3))}. \qquad \text{eq. (14)}$$

It is noted that the arctan-function is not without ambiguity across 360°. The arctan-function ranges only from −90° to +90°. In the examples used, a range from −180° to +180° would be preferable. This can be achieved via the function arctan 2(x,y), which is identical to the arctan(y/x), if $x \geq 0$. However, if x<0, the following applies:

$$\arctan_2(x, y) = \arctan\frac{y}{x} - \pi,$$

which is indicated in radians (rad). Hence, instead of equation (14), the following may apply:

$$\varphi_0 = \arctan_2(A,B)$$

wherein $A=(1-k_3)\cos\varphi_1 \cos\varphi_3(\sin\varphi_1 \cos\varphi_2-\sin\varphi_2 \cos\varphi_1)-(1-k_2)\cos\varphi_1 \cos\varphi_2(\sin\varphi_1 \cos\varphi_3-\sin\varphi_3 \cos\varphi_1);$ $B=(\sin\varphi_1 \cos\varphi_3-\sin\varphi_3 \cos\varphi_1)\cdot(k_2 \sin\varphi_2 \cos\varphi_1-\sin\varphi_1 \cos\varphi_2)-(\sin\varphi_1 \cos\varphi_2-\sin\varphi_2 \cos\varphi_1)\cdot(k_3 \sin\varphi_3 \cos\varphi_1-\sin\varphi_1 \cos\varphi_3)$.

The arctan applied to the right hand side of equation (14) provides the rotation angle $\varphi 0$. This computed rotation angle $\varphi 0$ is no longer (significantly) affected and/or corrupted by the disturbance field. The angle sensors 101 to 103 provide their data to be input in the above equation (14). Also, the numbers k2 and k3 are used, which can be fixed numbers that may depend on the ratios of magnetic field strengths at the positions z2, z3 compared to the position z1. Advantageously, the positions z1, z2 and z3 are located on the rotation axis 107. Hence, based on the system design, the positions of the sensors 101 to 103 along the z-axis are known.

In case of significant axial play, this might affect the field strengths on the angle sensors 101 to 103, but the ratio of the field strength on the angle sensor 102 over the field strength on the angle sensor 101 (i.e. k2) and the ratio of the field strength on the angle sensor 103 over the field strength on the angle sensor 101 (i.e. k3) changes significantly less.

If the function of the absolute value of the diametric magnetic field B along the rotation axis (i.e. the z-axis) is a linear function over z, the numbers k2 and k3 are constants even in case the magnet 109 experiences axially shifts.

It is an option to utilize magnets that provide such linear relationship. For example, a small stud hole may be drilled into the surface of the magnet, in particular into the surface that faces the angle sensors 101 to 103 (in case all angle sensors are on the same side of the magnet 109).

Each of the angle sensors 101 to 103 may have a sensitive plane that is perpendicular to the rotation axis 107. In case of AMR, GMR, TMR or vertical Hall angle sensors, the sensitive plane may be (substantially) identical to the main surface of the die, which accommodates the sensor element(s).

The position of the sensor element 104 to 106 may thus be defined as an intersect point where the sensitive plane of the angle sensors 101 to 103 intersects the rotation axis 107.

The sensor elements 104 to 106 respond to a projection of the magnetic field vector into the sensitive plane at these intersect points. If the magnet 109 rotates around the rotation axis 107, this projection rotates as well, which results in two orthogonal magnetic field components Bx, By; the third magnetic field component Bz points out of the sensitive plane and it may be omitted in a first approximation for these types of angle sensors.

The diametric magnetic field strength may be denoted as:

$$\sqrt{B_x^2 + B_y^2},$$

which is the strength of the projection of the field vector into the sensitive plane.

With regard to the terminology used herein, the axial and the lateral direction may be distinguished as follow: the axial direction is along the rotation axis 107 (z-axis); the lateral directions are perpendicular to the rotation axis, i.e., in the x-y-plane. Hence, there is an infinite number of lateral directions and only one axial direction.

As an option, the angle sensor 101 may be arranged in a first package on the top side of the printed circuit board 114 and the angle sensor 103 may be arranged in a second package on the bottom side of the printed circuit board 114. The angle sensor 102 may be arranged either within the first package or the second package.

It is noted that an increased reliability is another advantage of the system: the system allows obtaining three estimations of a rotation angle, i.e. φ1, φ2, φ3, which can be combined, e.g., for comparison purposes. For example, it may be decided that one of the angle sensor is defective if it produces a rotation angle that is substantially different (e.g., exceeding a predefined threshold for a variation between the rotation angles) from the rotation angles detected by the other two angle sensors. The defect may be notified, e.g., as an alarm, and/or the result of the defective angle may no longer used; in such example scenario, the rotation angles from the other two (non-defective) angle sensors may be averaged and used for further processing.

It is also an advantage that the system is able to determine whether the angle sensors 101 to 103 are monotonously distributed. In case of perfectly arranged angle sensors 101 to 103 and a homogeneous magnetic disturbance field, either:

$$\varphi_1 > \varphi_2 > \varphi_3$$

or $$\varphi_1 < \varphi_2 < \varphi_3$$

applies (in a modulo-360°-scheme). If the angle sensors 101 to 103 are not monotonously distributed, there is some error: Either the angle sensors 101 to 103 malfunction or the disturbance field is highly inhomogeneous.

As an option, the system may check the monotony only if the differences between the rotation angles φ1, φ2 and φ3 are above a predetermined threshold, which may be larger than an anticipated production spread. This avoids detecting an inhomogeneous distribution of angle sensors even in case there is none.

By inserting the rotation angle φ0 in equations (12), (13) and (6), (7), the system is able to compute the ratios:

$$\frac{Bd_x}{B_{x1}} \text{ and } \frac{Bd_y}{B_{y1}}.$$

Equation (12) or equation (13) can be used to calculate Bdx/Bx1 based on the rotation angles φ1, φ2 and φ3. This result can be inserted in equation (6) or in equation (7) to calculate Bdy/By1.

It is in particular an option to determine:

$$\frac{\sqrt{Bd_x^2 + Bd_y^2}}{\sqrt{B_{x1}^2 + B_{y1}^2}}, \qquad \text{eq. (15)}$$

which is independent from the rotation angle and provides the ratio of disturbance field to target field (target field:the field of the magnet).

Bdx/Bx1 can be used to determine:

$$\frac{Bd_x}{\sqrt{B_{x1}^2 + B_{y1}^2}} = \frac{Bd_x \cdot \cos\varphi_0}{B_{x1}}. \qquad \text{eq. (16)}$$

Accordingly, Bdy/By1 can be used to determine:

$$\frac{Bd_y}{\sqrt{B_{x1}^2 + B_{y1}^2}} = \frac{Bd_y \cdot \sin\varphi_0}{B_{y1}}. \qquad \text{eq. (17)}$$

Both equations (16) and (17) can be combined to reach equation (15), i.e., equations (16) and equation (17) are both squared and then added and subsequently the root is extracted from this addition. The value provided by equation (15) can be compared with a predetermined threshold to indicate whether or not the disturbance field is within an acceptable range.

Hence, the system can determine the amount of disturbance in relation to the magnetic field of the magnet. This ratio can be compared with at least one predefined limit and the system may issue an alarm if the disturbance has become too large, which may lead to unreliable or inaccurate results.

According to an example, two angle sensors are used to derive the rotation/angle information. However, the embodiments are not limited thereto, and more than two angle sensors may be used, where each sensor generates angle information used to derive the final measurement (i.e., a combined rotation angle).

Figure 3:
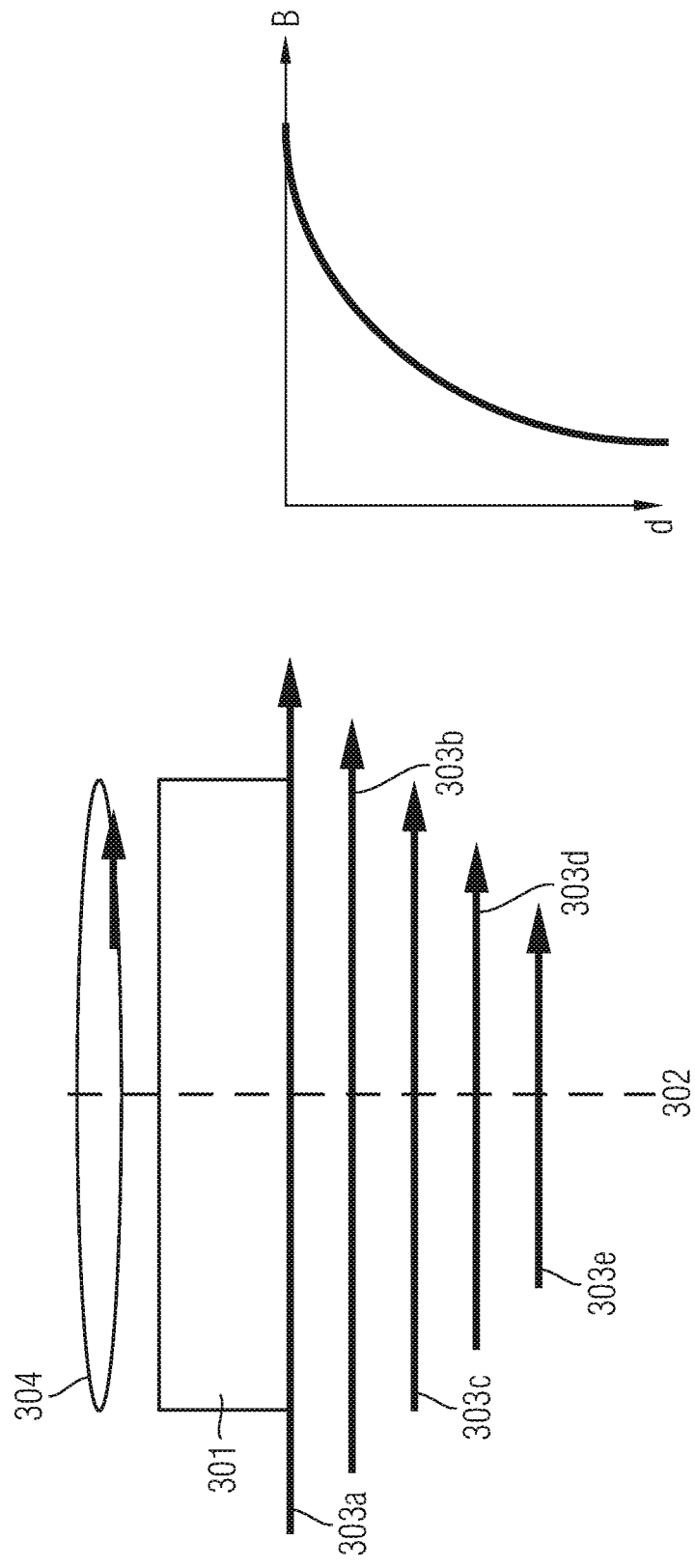
FIG. 3 shows a diametrically magnetized magnet that is arranged rotatably around a rotation axis.

The magnetic field of a magnet is strongly dependent on the distance of the sensor to the magnet. FIG. 3 shows a diametrically magnetized magnet 301 that is arranged rotatably around a rotation axis 302. An ellipse with an arrow 304 indicates a rotation of the magnet 301 around the rotation axis 302.

A magnetic target field is indicated by arrows 303a to 303e, wherein the size of the diametric magnetic field B decreases with an increasing distance d from the magnet 301; this is also indicated by a decreasing length of the arrows 303a to 303e. In other words, the lengths of the arrows 303a to 303e indicate the strength of the diametric magnetic field at an axial distance d from the magnet 301.

Figure 4:
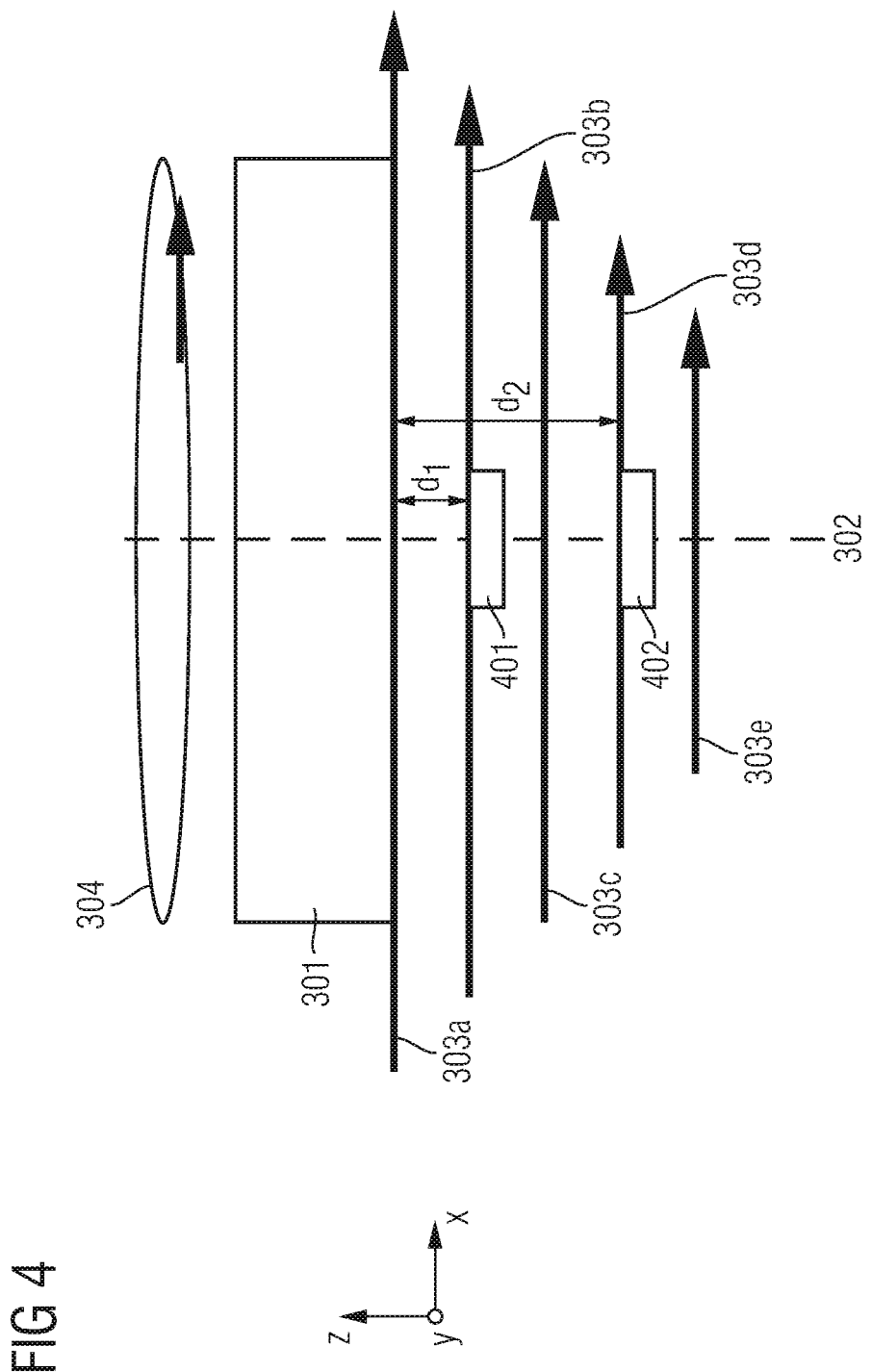
FIG. 4 shows the magnet illustrated in FIG. 3, where two angle sensors are placed on the rotation axis at different distances from the magnet.

FIG. 4 shows the magnet 301 and the rotation axis 302 of FIG. 3, wherein an angle sensor 401 is placed on the rotation axis 302 at a distance $d_1$ from the magnet 301 and an angle sensor 402 is placed on the rotation axis 302 at a distance $d_2$ from the magnet 301. In this example, the magnetic sensor elements are on top of the angle sensors 401 and 402.

In the presence of homogeneous disturbance fields, the angle sensors 401 and 402 may sense different rotation angles due to their differing distances $d_1$ and $d_2$ from the magnet 301, which result in different super-positions of fields from the magnet and disturbance field.

It is noted that in FIG. 4 a coordinate system with x-y-z-axes is shown, wherein the rotation axis 302 is along the z-axis and the sensors 401, 402 are arranged also in the x-y-plane.

Figure 5:
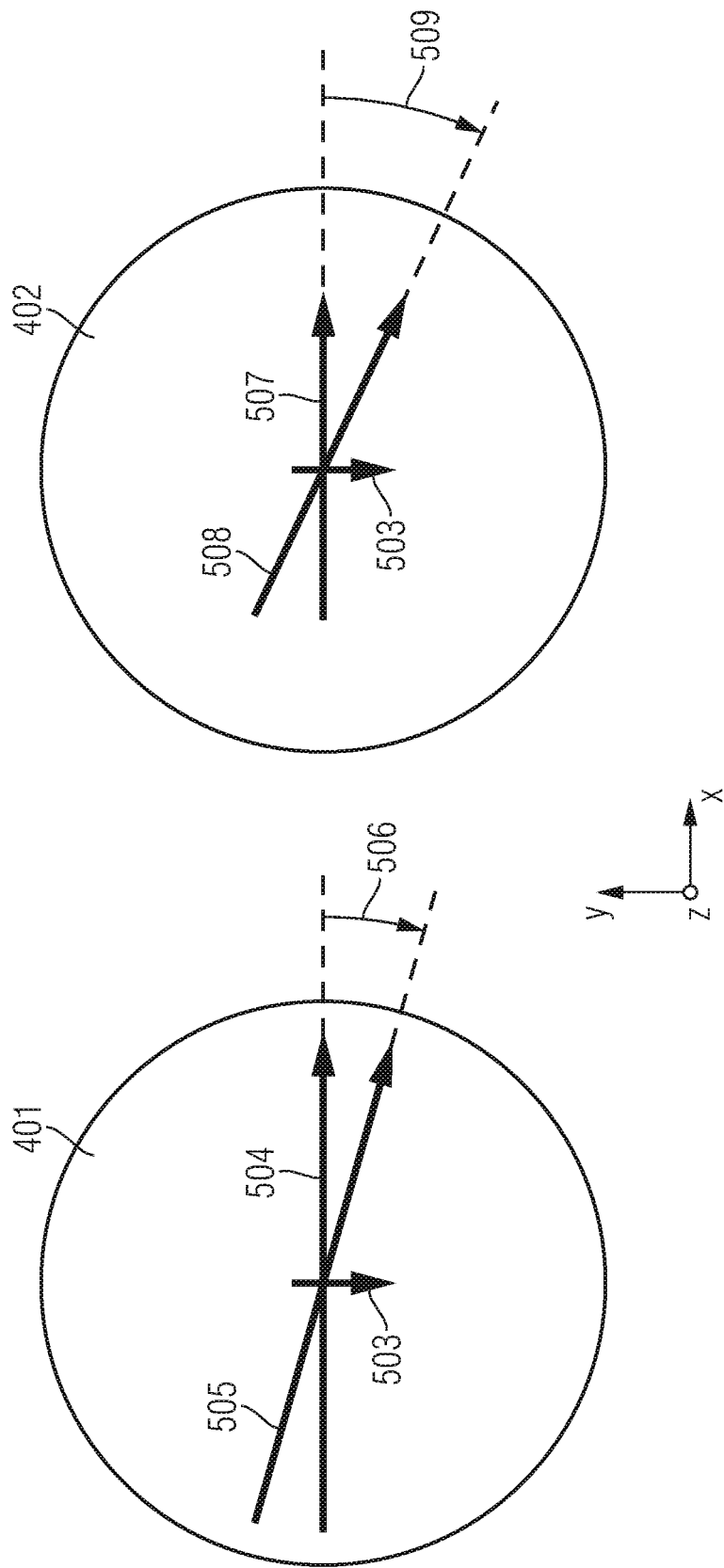
FIG. 5 shows the angle sensors illustrated in FIG. 4 from a different perspective indicating the rotational angle errors due to a disturbance field.

FIG. 5 shows the angle sensors 401 and 402, wherein both sensors experience a disturbance field vector 503, which is assumed to be of the same size for both angle sensors 401, 402. For the angle sensor 401, due to the disturbance field vector 503, a magnetic field vector 504 of the magnet 301 is skewed into a resulting magnetic field vector 505 leading to a rotation angle error 506. For the angle sensor 402, due to the disturbance field vector 503, a magnetic field vector 507 of the magnet 301 is skewed into a resulting magnetic field vector 508 leading to a rotation angle error 509.

Since the angle sensor 401 is closer to the magnet 301 than the angle sensor 402, the disturbance field vector 503 has a larger impact on the magnetic field vector 507 than on the magnetic field vector 504, which results in the rotation angle error 509 being larger than the rotation angle error 506.

Based on this example scenario, the actual rotation angle may be determined or approximated and even the size of the disturbance field may be determined or approximated. In order to achieve this, the field size of the magnet 301 is to be known.

It is noted that the coordinate system introduced in FIG. 4 is also shown in FIG. 5 to indicate the orientation of the angle sensors 401 and 402.

A linear combination of the rotation angles obtained by these two angle sensors may result in a rotation angle that is robust against disturbances.

The magnet 301 may point into a direction that is associated with 0° (as a starting reference). The angle sensors 401 and 402 may produce the following rotation angles:

$$\alpha_1 = \arctan\frac{Bd_n}{B_1 + Bd_p},$$

$$\alpha_2 = \arctan\frac{Bd_n}{B_2 + Bd_p},$$

where: α1 is the rotation angle determined by the angle sensor 401; α2 is the rotation angle determined by the angle sensor 402; Bdn is the diametric disturbance field component that is normal to the field of the magnet; Bdp is the diametric disturbance field component that is parallel to the field of the magnet; B1 is the diametric field of the magnet that affects the sensor 401; and B2 is the diametric field of the magnet that affects the sensor 402.

In case of a small disturbance field Bd the following applies:

$$\alpha_1 \approx \frac{Bd_n}{B_1},$$

$$\alpha_2 \approx \frac{Bd_n}{B_2} = \frac{Bd_n}{B_1} \cdot \frac{B_1}{B_2}.$$

A rotation angle $\alpha_{best\text{-}guess}$ may be determined as follows:

$$\alpha_{best\text{-}guess} = \alpha_1 + c \cdot (\alpha_1 - \alpha_2) ==$$
$$\frac{Bd_n}{B_1} + c \cdot \left(\frac{Bd_n}{B_1} - \frac{Bd_n}{B_1} \cdot \frac{B_1}{B_2}\right) == \frac{Bd_n}{B_1} \cdot \left(1 + c \cdot \left(1 - \frac{B_1}{B_2}\right)\right),$$

where c is a compensation factor.

The rotation angle αbest-guess should be 0°, because the magnet points in this 0° direction.

This results in:

$$\frac{Bd_n}{B_1} \cdot \left(1 + c \cdot \left(1 - \frac{B_1}{B_2}\right)\right) = 0,$$

$$c = \frac{1}{\frac{B_1}{B_2} - 1}.$$

An algorithm may be used to determine $\alpha_{best\text{-}guess} = \alpha_1 + c \cdot (\alpha_1 - \alpha_2)$.

The algorithm may use the constant c, which is given by the last equation and which depends only on the ratio of fields of the magnet on both angle sensors. Although the formula has been derived with the assumption of a special rotational position φ=0°, it works for all rotational positions.

B1/B2 may for example amount to 1.5. This results in c=2 and $$\alpha_{best\text{-}guess} = \alpha_1 + 2 \cdot (\alpha_1 - \alpha_2) = 3\alpha_1 - 2\alpha_2.$$

Figure 6:
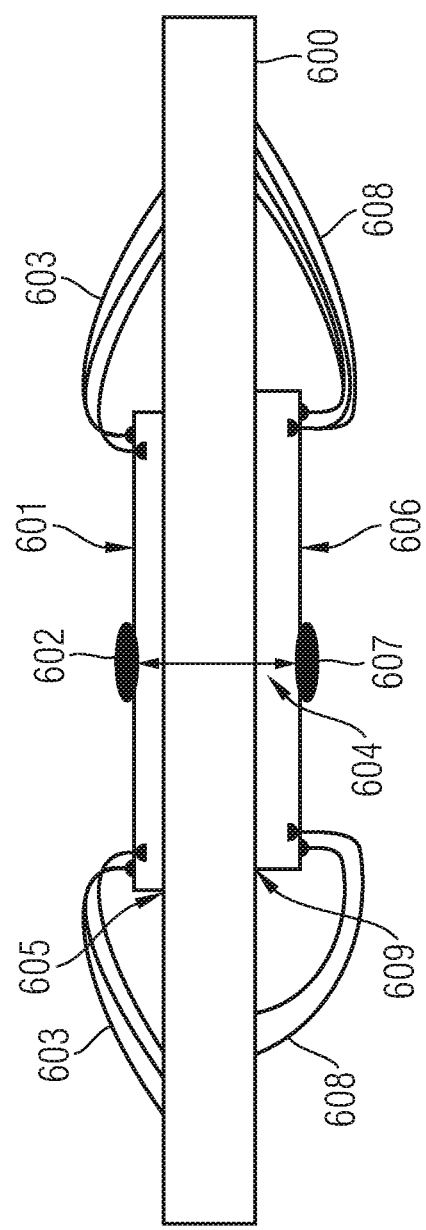
FIG. 6 shows an example arrangement of a dual-sensor-package.

FIG. 6 shows an example arrangement of a dual-sensor-package. A top die 601 is arranged on top of a leadframe 600, wherein an insulating glue 605 is arranged between the top die 601 and the leadframe 600. The top die 601 comprises a sensor element 602 and the top die 601 is electrically connected to the leadframe 600 via bond wires 603.

A bottom die 606 is arranged on the bottom of the leadframe 600, wherein an insulating glue 609 is arranged between the bottom die 606 and the leadframe 600. The bottom die 606 comprises a sensor element 607 and the bottom die 606 is electrically connected to the leadframe 600 via bond wires 608. In an example use case, the sensing elements 602 and 607 are spaced apart from each other by less than 600 μm.

In this dual-die setup the magnetic sensor elements 602 and 607 are on top of each other and both sensor elements 602, 607 are directly above each other so that they can be placed both on the rotation axis if the chips are orthogonal to the rotation axis.

A microcontroller (not shown in FIG. 6) can be connected to the leadframe 600 (and thereby to the sensor elements 602 and 607) to read the rotation angles and to perform the compensation to determine the combined rotation angle as proposed herein.

Advantageously, this approach allows for rotation angle measurements that are robust against disturbance fields.

The arrangement shown in FIG. 6 can be used to be placed below the magnet 301 of FIG. 4. In this case, the angle sensor 401 corresponds to the sensor element 602 and the angle sensor 402 corresponds to the sensor element 607. It is in particular an option to place the angle sensors 401 and 402 on separate or opposite sides of a printed circuit board (PCB) to increase the distance between the angle sensors (and the angle sensor elements). In this case, the angle sensors 401 and 402 may have packages on their own and each of the angle sensors 401 and 402 may comprise at least one angle sensor element. The packages may be placed on opposing sides of the printed circuit board (similar to what is described above with regard to FIG. 1).

It is also an option that the corrected rotation angle is calculated by one of the angle sensors if both angle sensors are integrated in a package. For example, a first angle sensor can be used for determining the corrected rotation angle in case the first and a second angle sensor are connected by bond wires or by leads: Hence, the first angle sensor obtains the data from the second angle sensor and computes the corrected (e.g., compensated) rotation angle based on the data determined by the first and the second angle sensors. In such scenario, a microcontroller may be provided for reading such corrected rotation angle from the first sensor.

Hence, this example utilizes the fact that the diametric field from the magnet is different at different distances from the magnet; placing angle sensors at different distances from the magnet allows for a robust setup to at least partially compensate magnetic disturbance fields.

The devices and methods provided herein may in particular be based on at least one of the following embodiments. In particular, combinations of the following features of the following embodiments could be utilized in order to reach a desired result. The features of the method could be combined with any feature(s) of the device, apparatus or system or vice versa.

A magnetic angle sensor device is provided including: a shaft rotatable around a rotation axis; a magnetic field source, wherein the magnetic field source is connected to the shaft; a first magnetic angle sensor and a second magnetic angle sensor, where the first magnetic angle sensor generates a first signal that represents a first angle based on a first diametric magnetic field applied to the first magnetic angle sensor, where the second magnetic angle sensor generates a second signal that represents a second angle based on a second diametric magnetic field applied to the second magnetic angle sensor, and a combined rotation angle is determined based on the first signal and on the second signal.

Specifically, the first angle is a first error angle based on the first diametric magnetic field from the magnetic field source and a disturbance magnetic field, both applied to the first magnetic angle sensor, where the disturbance magnetic field causes a first resulting magnetic field vector to deviate from a first magnetic target field vector by the first error angle. Similarly, the second angle is a second error angle based on a second diametric magnetic field from the magnetic field source and the disturbance magnetic field, both applied to the second magnetic angle sensor, where the disturbance magnetic field causes a second resulting magnetic field vector to deviate from a second magnetic target field vector by the second error angle.

In instances where a third magnetic angle sensor is provided, the third magnetic angle sensor is configured to generate a third signal that represents a third error angle based on a third diametric magnetic field from the magnetic field source and the disturbance magnetic field, both applied to the third magnetic angle sensor, where the disturbance magnetic field causes a third resulting magnetic field vector to deviate from a third magnetic target field vector by the third error angle. The first magnetic target field vector, the second magnetic target field vector, and the third magnetic target field vector may be oriented in the same direction.

A combining circuit (e.g., combining logic, a processor, and/or a microcontroller) may be operatively connected to the first magnetic angle sensor and the second magnetic angle sensor, and configured to receive the first signal and the second signal, and determine the combined rotation angle based on the first signal and on the second signal. Specifically, the combining circuit is configured to determine the first error angle and the second error angle from the first signal and the second signal, respectively, and determine the combined rotation angle based on the first error angle and the second error angle. The processor may be configured to generate a measurement signal that represents the combined rotation angle. The processor may use the measurement signal representing the combined rotation angle for further processing and/or may output the measurement signal to another device.

The magnetic field source is in particular rigidly attached to the shaft.

Each of the magnetic angle sensors may be a magnetic field angle sensor.

The magnetic field is a vector at each point. This vector can be decomposed into a vector parallel to the rotation axis and a vector orthogonal to the rotation axis. The latter is the diametric magnetic field.

If a chip is oriented with its major surface perpendicular to the rotation axis and magneto-resistive elements are sputtered to its major surface, these elements respond to diametric magnetic fields. The same chip may comprise vertical Hall effect devices, which also respond to diametric magnetic field components. Conversely, if Hall plates are oriented perpendicular to the rotation axis they respond to the axial magnetic field component.

In practice the chip may be tilted by a few degrees due to assembly tolerances. If the major surface of a chip is not exactly perpendicular to the rotation axis, the magneto-resistive elements on its major surface respond mainly to the diametric magnetic field component but also a little bit to the axial magnetic field component. As long as the normal to the major chip surface deviates by less than 10° from the direction of the rotation axis, the magneto-resistive elements still essentially see the diametric magnetic field components and only negligible axial magnetic field components.

As an option, Vertical Hall effect devices may be used, because they also detect predominately the diametric magnetic field components, i.e., the magnetic field components parallel to the major chip surface, which is essentially orthogonal to the rotation axis.

The example presented may be particularly robust against magnetic disturbance fields. However, that the magnetic field gradient shown in FIGS. 3 and 4 may be too small to implement this solution in an integrated application with two dies in one package. Thus, it may be beneficial to use a magnet arrangement that produces a stronger magnetic field gradient. In particular, further embodiments provide a magnetic field arrangement that produces a differential magnetic field having a stronger magnetic field gradient than that produced in FIG. 3.

Figure 7:
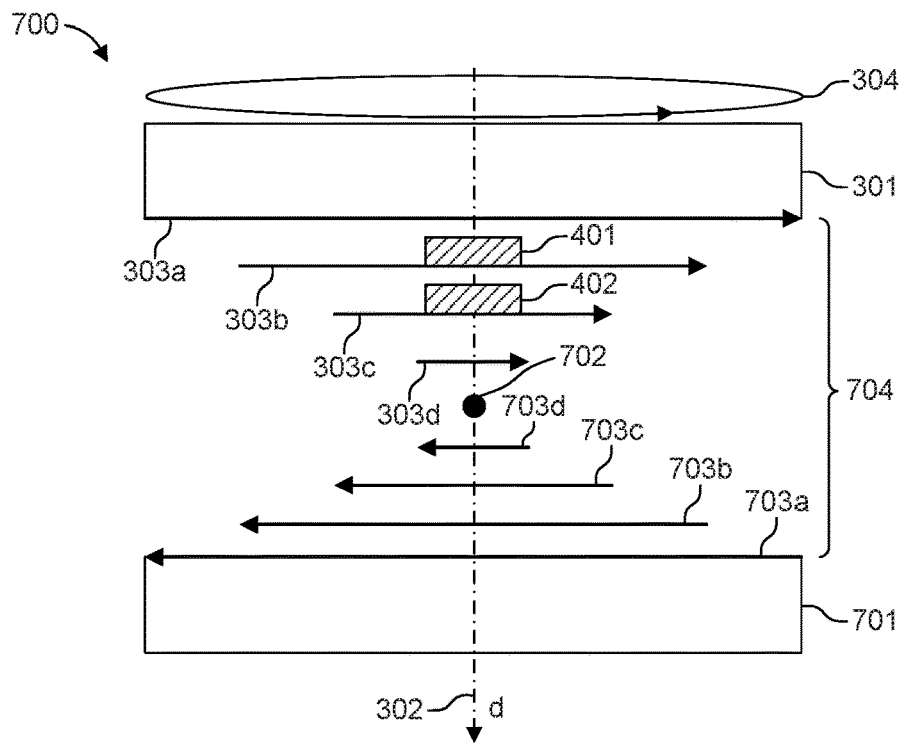
FIG. 7 shows a dual magnet system, where two angle sensors are placed on the rotation axis at different distances from two diametrically magnetized magnets according to one or more embodiments.

FIG. 7 shows a dual magnet system 700, where two angle sensors 401 and 402 are placed on the rotation axis at different distances from two diametrically magnetized magnets 301 and 701 according to one or more embodiments. Thus, the two magnets 301 and 701 are planar (disc) diametral magnets. The two diametrically magnetized magnets 301 and 701 may be arranged in proximity to each other such that they form a quadrupole magnet arrangement that includes four poles made up from two oppositely oriented dipoles. As such, the two diametrically magnetized magnets 301 and 701 produce a differential magnetic field in an area 704 between the two magnets.

Generally, a differential magnetic field is a field that has field difference between the two sensing positions spaced apart along a direction of the field-gradient (e.g., along the direction of the rotation axis 302). Specifically, a differential magnetic field is defined as a field that has a field-gradient that includes a field direction change or field orientation change such that, for at least two different positions inside the magnetic field, the field directions/orientations at the at least one in two different positions are antiparallel to each other. That is, the field directions/orientations are oriented in opposite directions.

The two angle sensors 401 and 402 are placed in the area 704 between the two magnets 301 and 701. In some example, the area 704 between the two magnets 301 and 701 may be referred to as a sensor cavity.

The magnet 301 has a magnetic target field vector in the +x-direction (i.e., the positive x-direction) that is projected into the x-y plane. The magnet 701 has a magnetic target field vector in the-x-direction (i.e., the negative x-direction) that is projected into the x-y plane. Thus, the magnetizations of magnets 301 and 701 are opposite, or antiparallel, to each other. In addition, the magnets 301 and 701 may be coupled to a rotation shaft that has its axis of rotation aligned with the rotation axis 302. Thus, if the magnets 301 and 701 rotate about the rotation axis 302, the projection of the magnets (i.e., the magnetic field gradient) also rotates in the x-y plane. As the magnets 301 and 701 rotate, the sensors 401 and 402 are kept static (i.e., rotationally fixed) and detect the rotating magnetic field.

The magnetic field gradient B decreases with an increasing distance d from the magnet 301 until the magnetic field produced by magnet 301 is nullified by the opposing magnetic field produced by magnet 701 at a magnetic field gradient crossover point 702. The crossover point 702 is where the magnetic fields produced by magnetics 301 and 701 cancel each other out and reach equilibrium. As such the magnetic field gradient (i.e., field size) is zero at this point.

From the crossover point 702, the magnetic field gradient B increases with an increasing distance to the magnet 701, or conversely decreases with increasing distance from magnet 701 towards the crossover point 702. The crossover point 702 may be exactly centered between the magnets 301 and 701 or offset by a distance from the center depending on the field strengths produced by the magnets 301 and 701.

According, a differential magnetic target field is indicated by arrows 303a to 303d, crossover point 702, and arrows 703a to 703d. The size of the diametric magnetic field B decreases with an increasing distance d from the magnet 301 until the crossover point 702; this is also indicated by a decreasing length of the arrows 303a to 303d. In other words, the lengths of the arrows 303a to 303d indicate the strength of the differential diametric magnetic field at an axial distance d from the magnet 301.

Similarly, the size of the diametric magnetic field B increases with an increasing distance d from the crossover point 702 towards magnet 701; this is also indicated by an increasing length of the arrows 703d to 703a. In other words, the lengths of the arrows 703a to 703d indicate the strength of the differential diametric magnetic field at an axial distance d from the magnet 301 (or from the magnet 701). The field directions at locations or distances along the rotation axis 302 corresponding to arrows 303a to 303d are different and antiparallel to the field directions at locations or distances along the rotation axis 302 corresponding to arrows 703d to 703a.

According to this magnet arrangement, a magnetic field having a stronger magnetic field gradient is realized in an area in which the angle sensors 401 and 402 are placed.

In the presence of homogeneous disturbance fields, the angle sensors 401 and 402 may sense different rotation angles due to their differing distances $d_1$ and $d_2$ from the magnet 301, which result in different super-positions of fields from the magnet and disturbance field. In particular, a disturbance field has a greater impact on the rotation angle error, and thus the resulting magnetic field vector, corresponding to a weaker magnetic field relative to a stronger magnetic field. Thus, by placing the angle sensors 401 and 402 at different field-size gradients of the magnetic field, two different rotation angle errors can be detected by the angle sensors 401 and 402.

Both angles of the first sensor 401 and the second sensor 402 can be used by the combining circuit described herein to calculate a corrected angle $\alpha_{corr}$ by:

$$\alpha_{corr} = \alpha_1 - (\alpha_1 - \alpha_2) \cdot c \qquad \text{eq. (18)},$$

where $\alpha 1$ is the rotation angle determined by the angle sensor 401; $\alpha 2$ is the rotation angle determined by the angle sensor 402; and c is a compensation factor depending on the sensor distance and magnetic field distribution across the distance.

There is also a way to optimize the compensation factor c depending on the field relationship to each sensor in normal operation to determine a final output angle error ε of zero:

$$\varepsilon = \varepsilon_1 - (\varepsilon_1 - \varepsilon_2) \cdot c = 0 \qquad \text{eq. (19)},$$

where $\varepsilon_1$ is the angle error corresponding to the angle sensor 401 and $\varepsilon_2$ is the angle error corresponding to the angle sensor 402. The angle error $\varepsilon_1$ and $\varepsilon_2$ of each sensor can be related to the disturbance-field sizes Bd versus the operating target field size $B_1$ and $B_2$, where the target field size $B_1$ is the field size of the magnetic field at sensor 401 and the target field size $B_2$ is the field size of the magnetic field at sensor 401:

$$\varepsilon_1 \sim \frac{B_s}{B_1}, \qquad \text{eq. (20)}$$

$$\varepsilon_2 \sim \frac{B_s}{B_2}. \qquad \text{eq. (21)}$$

In this case, the optimum compensation factor c can be determined by:

$$c = \frac{B_2}{B_1 - B_2}. \qquad \text{eq. (22)}$$

Accordingly, the combining circuit is configured to determine a first error angle and a second error angle from a first signal received from the first sensor 401 and a second signal received from the second sensor 402, respectively, and determine the combined rotation angle based on the first error angle and the second error angle. The processor may be configured to generate a measurement signal that represents the combined rotation angle. The processor may use the measurement signal representing the combined rotation angle for further processing and/or may output the measurement signal to another device.

Figure 8A:
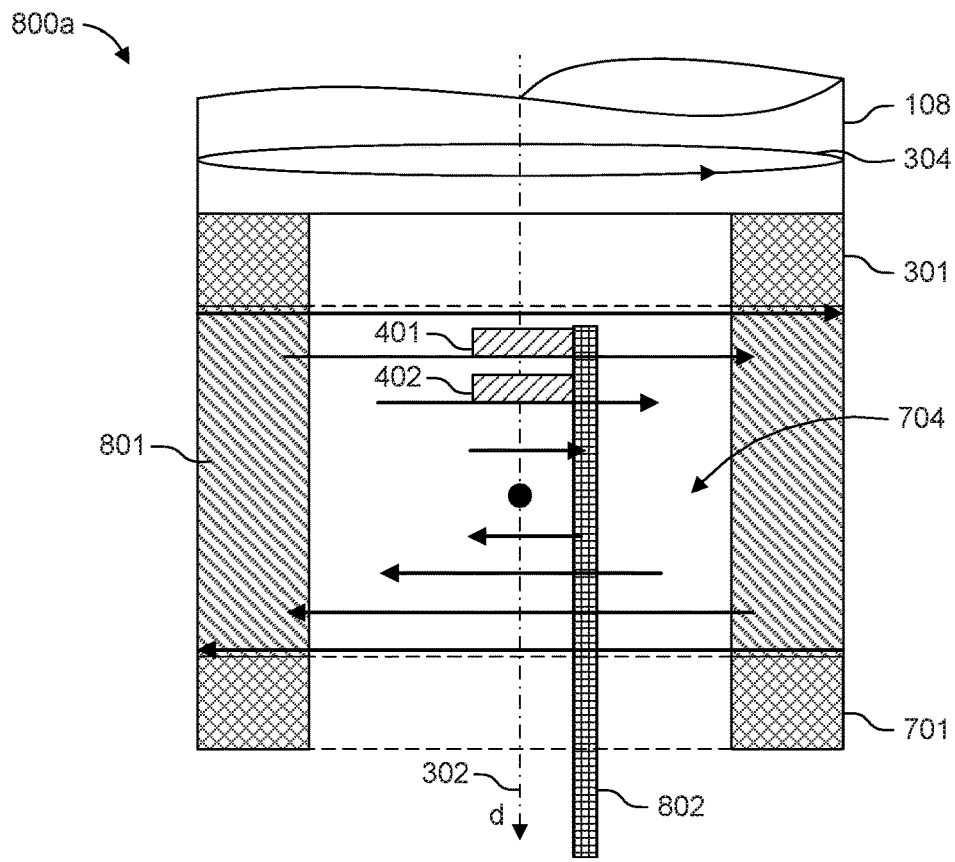
FIG. 8A shows a dual magnet system that includes two ring-magnets arranged to generate a differential magnetic field according to the principles described in reference to FIG. 7 according to one or more embodiments.

FIG. 8A shows a dual magnet system 800a that includes two ring-magnets 301 and 701 arranged to generate a differential magnetic field according to the principles described in reference to FIG. 7 according to one or more embodiments. In particular, the dual magnet system 800a includes a shaft 108 that rotates around a rotation axis 302. The ring-magnet 301 is attached to the bottom of the shaft 108, and the magnet 301 projects a magnetic field in the x-direction.

The magnets 301 and 701 are arranged such that they form a quadrupole magnetic arrangement to generate the magnetic field (i.e., a target field) inside the area 704.

In addition, the dual magnet system 800a includes a magnet coupler structure 801 that couples the two magnets 301 and 701 together, although at a predetermined distance apart from each other. The magnet coupler structure 801 may be made of a nonmagnetic material, such as plastic, that does not interfere with the differential rotating magnetic field. As a result of the coupling, both magnets 301 and 701 rotate as the shaft 108 rotates, thus creating the magnetic field gradient that rotates as the shaft rotates.

The dual magnet system 800a further includes a substrate 802, such as a printed circuit board, to which the sensors 401 and 402 are electrically coupled. The substrate 802 is inserted through the opening of the ring magnet 701 such that the sensors 401 and 402 are placed within the target field inside area 704. Thus, the shape of the two magnets 301 and 701 enable connectivity of angle sensors 401 and 402 through the at least one of the holes of the ring-magnets.

The two angle sensors 401 and 402 are placed on the rotation axis 302 at different distances from two diametrically magnetized magnets 301 and 701. The placement of the substrate 802 through the hold of magnet 701 can be such that the sensors 401 and 402 are placed at a desired distance from the magnets 301 and 701. Thus, the magnitude of the target field at each sensor location is known based on the distance of each sensor from the magnets 301 and 701. As the magnets 301 and 701 rotate, the sensors 401 and 402 are kept static (i.e., rotationally fixed) and detect the rotating magnetic field.

Figure 8B:
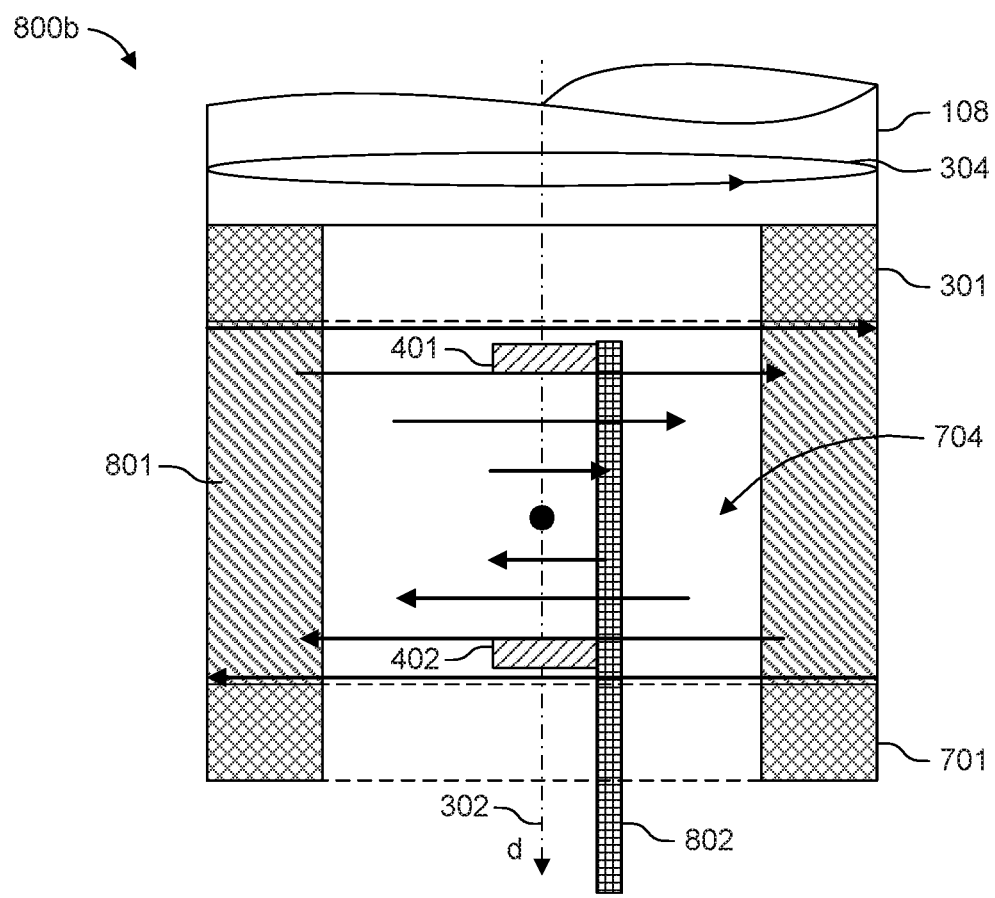
FIG. 8B shows a dual magnet system that includes two ring-magnets arranged to generate a differential magnetic field according to the principles described in reference to FIG. 7 according to one or more embodiments.

FIG. 8B shows a dual magnet system 800b that includes two ring-magnets 301 and 701 arranged to generate a differential magnetic field according to the principles described in reference to FIG. 7 according to one or more embodiments. In particular, the dual magnet system 800b is similar to the dual magnet system 800a depicted in FIG. 8A, with the exception that the sensors 401 and 402 are placed in oppositely oriented portions of the differential magnetic field (i.e., the target field). Here, oppositely oriented portions means that the magnetic target field vectors at the two sensor locations are antiparallel to each other. As a result, the sensors 401 and 402 are placed in different magnetic orientations of the target field.

In this case, the oppositely oriented portions of the magnetic field gradient are equal, but opposite in magnitude, to each other. However, it is also possible to place the sensors 401 and 402 in oppositely oriented portions of the magnetic field gradient that are not equal to each other in magnitude. It will be appreciated that the sensors 401 and 402 may be arranged in this manner in any embodiment described herein that uses a differential magnetic field.

Figure 9:
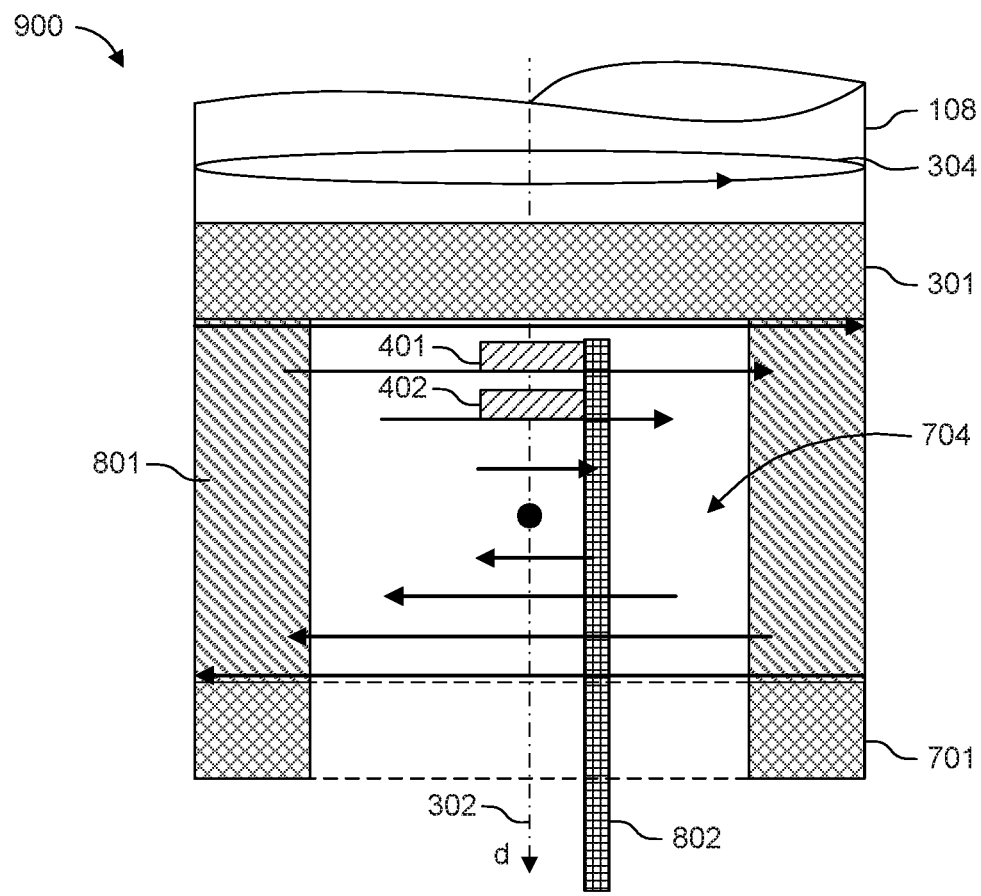
FIG. 9 shows a dual magnet system that includes a planar diametral magnet in combination with a ring-magnet arranged to generate a differential magnetic field according to the principles described in reference to FIG. 7 according to one or more embodiments.

FIG. 9 shows a dual magnet system 900 that includes a planar diametral magnet 301 in combination with a ring-magnet 701 arranged to generate a differential magnetic field according to the principles described in reference to FIG. 7 according to one or more embodiments. The dual magnet system 900 is similar to the dual magnet system 800 shown in FIG. 8A, with the exception that magnet 301 is a diametral magnetized magnet. Thus, a planar diametral magnet 301 is used in combination with a ring-magnet 701 to generate the magnetic field gradient. The shape of the ring-magnet 701 enables connectivity of the angle sensors 401 and 402 through its hole such that the sensors can be placed into the target field.

Figure 10:
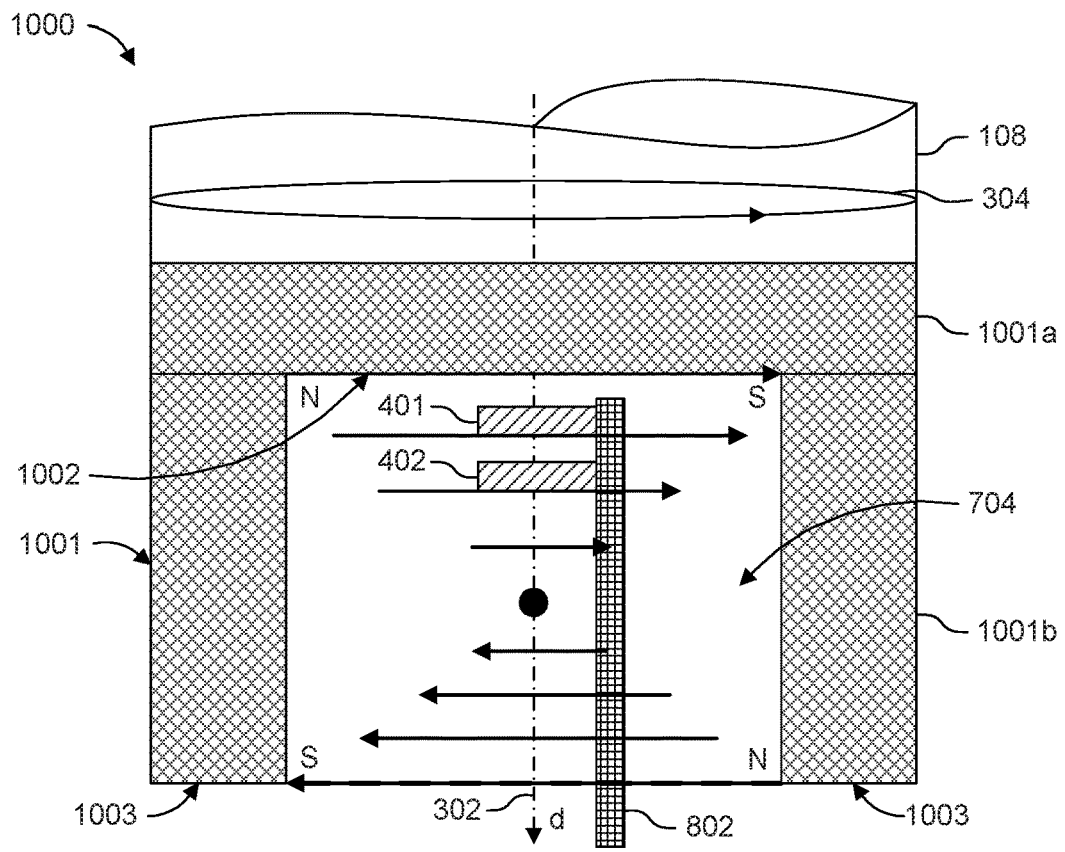
FIG. 10 shows a quadrupole magnetic sensor arrangement configured to generate a differential magnetic field according to the principles described in reference to FIG. 7 according to one or more embodiments.

FIG. 10 shows a quadrupole magnetic sensor arrangement 1000 configured to generate a differential magnetic field according to the principles described in reference to FIG. 7 according to one or more embodiments. In particular, a magnet arrangement 1001 is provided with a magnetization to form a quadrupole, and may be referred to as a diametral quadrupole magnet. The magnet arrangement 1001 may be a cylindrical magnet of single-integral construction (i.e., it is a one-piece member). The magnet arrangement 1001 is coupled to the shaft 108 and may have a cylindrical shape with one end-face 1002 closed and the opposite end-face 1003 open to form a cavity 704 at an inside region of the magnet arrangement 1001. Thus, the magnet arrangement 1001 may be a hollow cylinder and the cavity 704 may be a bore that extends from one open end-face 1003 of the magnet 1001 partially through the magnet towards the closed end-face 1002.

Alternatively, the magnet arrangement 1001 may be comprised of two magnets: a diametral disc-magnet 1001a at the closed end of the magnet arrangement placed at the shaft-end of the shaft 108 and diametral ring-magnet 1001b to form the open end and cavity of the magnet arrangement. The disc-magnet and the ring magnet are coupled together to form a cylindrical magnet with a hollow cavity 704.

The open end-face 1003 and cavity 704 enables connectivity of the angle sensors 401 and 402 through the opening such that the sensors can be placed into the target field.

Figure 11:
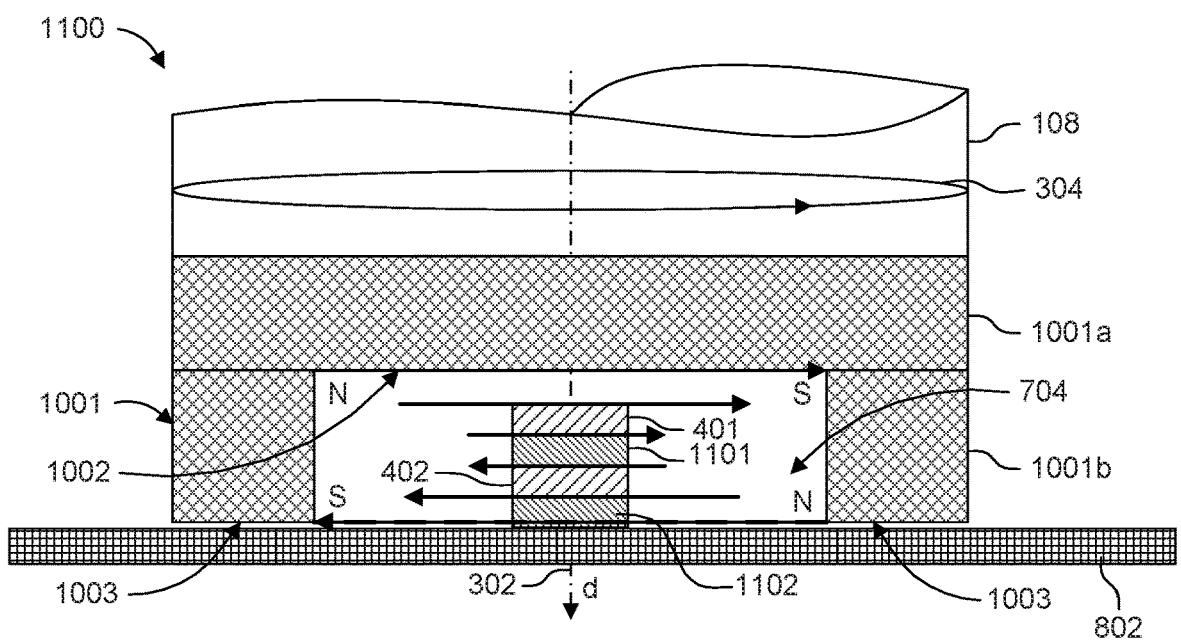
FIG. 11 shows a quadrupole magnetic sensor arrangement configured to generate a differential magnetic field according to the principles described in reference to FIG. 7 according to one or more embodiments.

FIG. 11 shows a quadrupole magnetic sensor arrangement 1100 configured to generate a differential magnetic field according to the principles described in reference to FIG. 7 according to one or more embodiments. In particular, the quadrupole magnetic sensor arrangement 1100 is similar to the quadrupole magnetic sensor arrangement 1000 shown in FIG. 10, with the exception that the substrate 802 is arranged horizontally to span across the open end-face 1003 of the magnet arrangement 1001. The magnet arrangement 1001 and the substrate 802 are separated from each other by a gap such that, as the magnet arrangement 1001 rotates, the sensors 401 and 402 are kept static (i.e., rotationally fixed) such that the sensors 401 and 402 detect the rotating magnetic field.

The sensors 401 and 402 are stacked on the substrate 802 and aligned on the rotation axis 302. The sensors 401 and 402 may be stacked by use of non-magnetic distance elements (i.e., spacers) 1101 and 1102 and/or a mold body, using similar principles described in FIG. 1. Thus, the sensors 401 and 402 may be placed at different field-size gradients and/or different magnetic orientations of the magnetic field. In this case, the sensors 401 and 402 are placed in different magnetic orientations of the target field of equal but opposite magnitude. However, it will be appreciated that the sensors 401 and 402 may be placed in different field-size gradients of the same magnetic orientation or different field-size gradients of different magnetic orientations.

Figure 12:
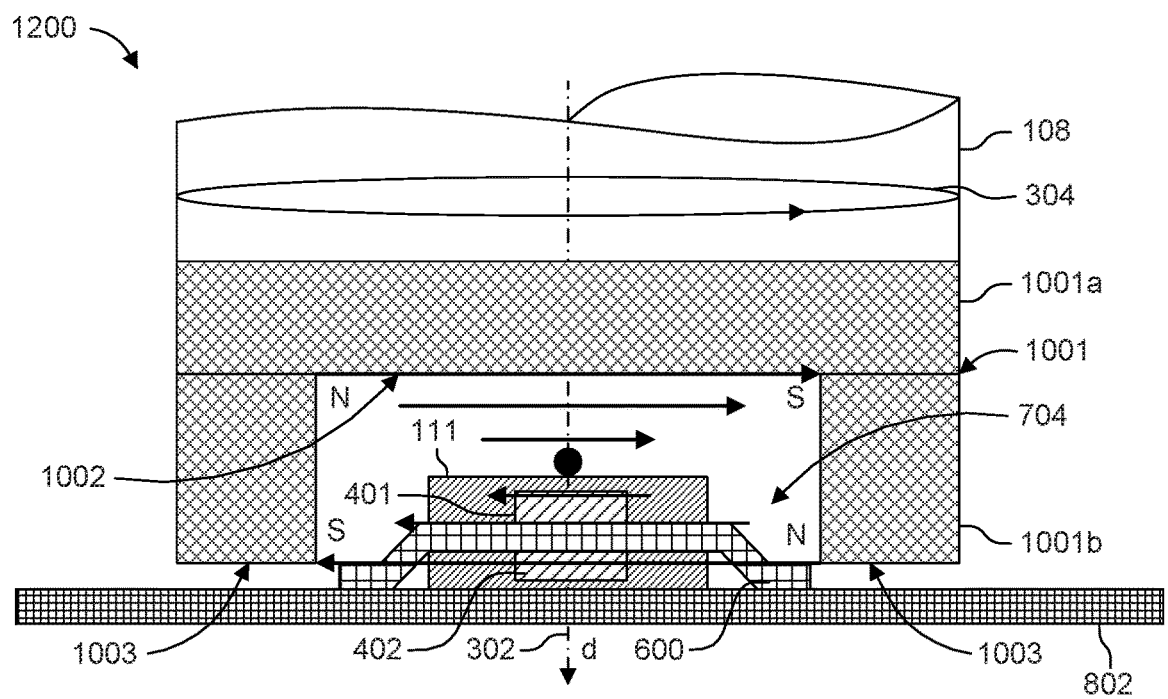
FIG. 12 shows a quadrupole magnetic sensor arrangement configured to generate a differential magnetic field according to the principles described in reference to FIG. 7 according to one or more embodiments.

FIG. 12 shows a quadrupole magnetic sensor arrangement 1200 configured to generate a differential magnetic field according to the principles described in reference to FIG. 7 according to one or more embodiments. In particular, the quadrupole magnetic sensor arrangement 1200 is similar to the quadrupole magnetic sensor arrangement 1100 shown in FIG. 11, with the exception that the sensors 401 and 402 are placed in a same magnetic orientation of the magnetic field gradient.

In particular, sensor 402 is placed so that it is aligned, in-plane, with the open end-face of the magnet arrangement 1001 (i.e., aligned with an outer circumference of the magnet arrangement). In other word, the sensor 402 is placed at the outer edge of the cavity 704 to be aligned with the outer edge of the target field 703a. The magnet arrangement 1001 and the substrate 802 are separated from each other by a gap such that, as the magnet arrangement 1001 rotates, the sensor package is kept static (i.e., rotationally fixed) such that the sensors 401 and 402 detect the rotating magnetic field.

Sensors 401 and 402 are arranged in a dual-sensor package, as similarly described in FIG. 6, such that sensor 401 is arranged on the one side of the leadframe 600 and sensor 402 is arranged on an opposite side of the leadframe 600. The sensors 401 and 402 and a portion of the leadframe 600 are encapsulated by mold body 111.

This setup has the benefit, that PCB based solutions can be used at the end of the shaft and the field gradient on the outer side of this setup can be used for external field compensation. The orientation of the substrate with a stacked sensor arrangement can also be used in the embodiments shown in FIGS. 8A, 8B, and 9.

Figure 13:
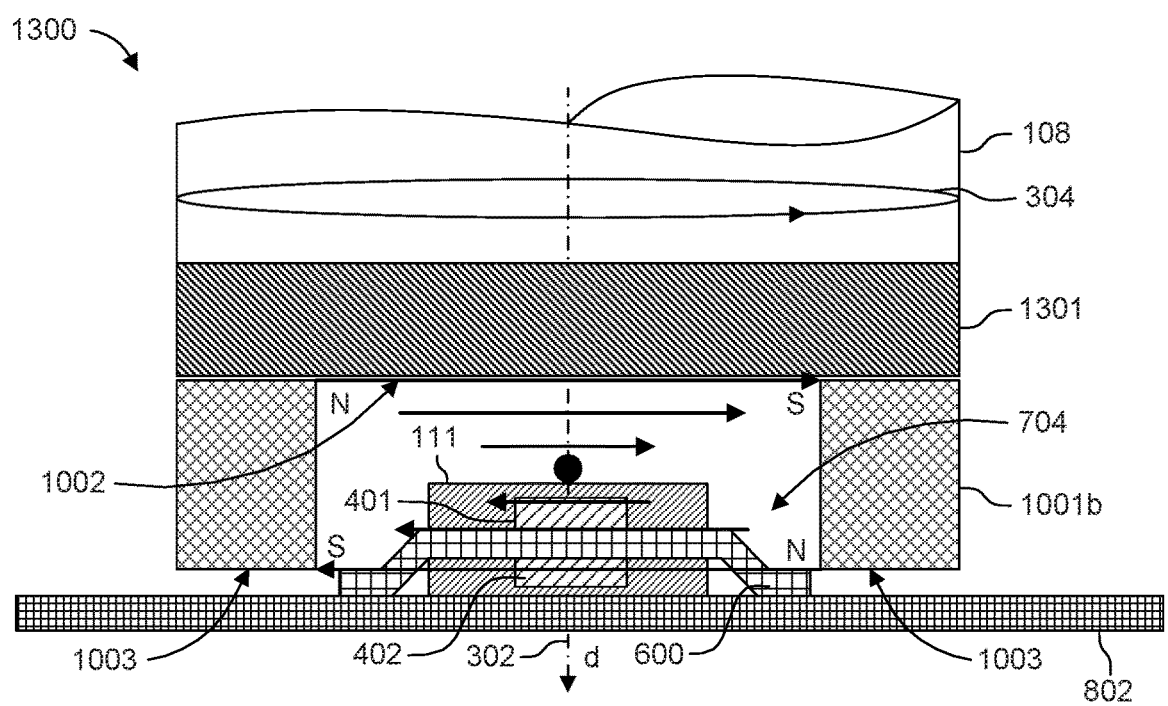
FIG. 13 shows a quadrupole magnetic sensor arrangement configured to generate a differential magnetic field according to the principles described in reference to FIG. 7 according to one or more embodiments.

FIG. 13 shows a quadrupole magnetic sensor arrangement 1300 configured to generate a differential magnetic field according to the principles described in reference to FIG. 7 according to one or more embodiments. In particular, the quadrupole magnetic sensor arrangement 1300 is similar to the quadrupole magnetic sensor arrangement 1200 shown in FIG. 12, with the exception that a non-magnetic spacer 1301 is coupled to and interposed between the shaft 108 and the diametral ring-magnet 1001b. The diametral disc portion 1001a is not used. The diametral ring-magnet 1001b is a diametral magnet quadrupole ring that produces the magnetic field gradient inside the cavity 704.

This setup has the benefit, that PCB based solutions can be used at the end of the shaft and the field gradient on the outer side of this setup can be used for external field compensation. Similarly, the non-magnetic spacer 1301 may be used in FIGS. 10 and 11 instead of portion 1001a of the magnet arrangement 1001.

In view of the above, a differential magnetic angle measurement setup and magnet is used to enable external field disturbance suppression together with high accuracy in case of no external field disturbance.

According to one or more embodiments, the first magnetic angle sensor determines/generates the first signal that represents the first angle between the first diametric magnetic field applied to the first magnetic angle sensor and a first reference direction, and the second magnetic angle sensor determines/generates the second signal that represents the second angle between the second diametric magnetic field applied to the second magnetic angle sensor and a second reference direction.

In an embodiment, the first reference direction and the second reference direction are the same.

In an embodiment, the magnetic angle sensor device include a third magnetic angle sensor, wherein the third magnetic angle sensor determines/generates a third signal that represents a third angle based on a third diametric magnetic field applied to the third magnetic angle sensor, and the combined rotation angle is determined based on the first signal, the second signal, and the third signal.

It is an option that more than three magnetic angle sensors are provided to determine the combined rotation angle.

In an embodiment, the third magnetic angle sensor determines the third signal that represents the third angle between the third diametric magnetic field applied to the third magnetic angle sensor and a third reference direction.

In an embodiment, at least two out of the following are the same: the first reference direction; the second reference direction; and the third reference direction.

In an embodiment, the magnetic field source includes at least one permanent magnet.

In an embodiment, the magnetic angle sensors are located at different z-positions (e.g., distances) from the magnetic field source, wherein each z-position is defined as a perpendicular dropped from the position of the magnetic angle sensor onto the rotation axis.

The magnetic field source has a minimum distance $d_{min}$ to the nearest magnetic angle sensor. A distance between this magnetic angle sensor and any other magnetic angle sensor may in particular be equal to or larger than $\frac{1}{5} d_{min}$.

In an embodiment, each of the magnetic angle sensors includes at least one magnetic sensor element that is arranged substantially on the rotation axis or in particular spaced apart from the rotation axis by less than 1 mm.

It may be an option that the magnetic angle sensor includes a plurality of magnetic sensor elements. As not all magnetic sensor elements may be arranged on the very same spot, the magnetic sensor elements may be arranged adjacent to the rotation axis, in particular in a symmetrical pattern around the rotation axis. It is also an option to choose a somewhat asymmetrical pattern arranging at least two magnetic sensor elements around the rotation axis. In such scenario, the magnetic angle sensor may determine an angle slightly off the rotation axis, e.g., by 0.1 mm to 0.2 mm (e.g., up to 0.2 mm). Such positioning, however, is also covered by the term "substantially on the rotation axis".

In an embodiment, each of the magnetic angle sensors includes at least two magnetic sensor elements that are arranged such that the angle of the diametric field vector on the rotation axis is measured.

In an embodiment, each of the two magnetic angle sensors includes a magnetic sensor element, where at least one magnetic sensor element per magnetic angle sensor is arranged at a different distance from the magnetic field source.

Hence, the magnetic field provided by the magnetic field source may have a different impact on each of the magnetic angle sensors, i.e., on at least one of the magnetic sensor elements of the magnetic angle sensors.

In an embodiment, any of the signals includes two signal components, in particular a sine signal component and a cosine signal component.

For example, each of the magnetic angle sensors may provide a signal comprising a sine signal component and a cosine signal component.

In an embodiment, the magnetic angle sensors are arranged such that the diametric magnetic field strengths acting on the magnetic angle sensors caused by the magnetic field source are mutually different.

It is noted that the magnetic angle sensors may be arranged such that the diametric magnetic field strengths acting on the magnetic angle sensors caused by the magnetic field source are mutually different by at least 10%.

In an embodiment, the diametric magnetic fields acting on the magnetic angle sensors are mutually parallel or mutually antiparallel.

In an embodiment, the device further includes a combining circuit, which combines the signals provided by the magnetic angle sensors to determine the combined rotation angle.

The combining circuit may be arranged with either one of the magnetic angle sensors or it may be arranged externally. The combining may be in particular performed by a processor or microcontroller.

The combining circuit may combine the first signal and the second signal or the first, the second, and the third signal to derive the combined rotation angle.

The combined rotation angle is an output signal that is indicative of the rotational position of the shaft.

In an embodiment, the combined rotation angle is determined as a linear combination comprising the first signal and the second signal.

In an embodiment, the linear combination includes coefficients that depend on a ratio of the diametric magnetic fields of the magnetic field source onto the magnetic angle sensors.

In an embodiment, the linear combination includes coefficients that depend only on a ratio of the diametric magnetic fields of the magnetic field source onto the magnetic angle sensors.

In an embodiment, the combined rotation angle is determined based on a distance of the magnetic angle sensors from the magnetic field source.

For example, the combined rotational angle is determined based on the ratio of the diametric magnetic fields on the second versus the first magnetic angle sensor and on the third versus the first magnetic angle sensor (in case of three magnetic angle sensors).

The combined rotation angle may in particular be determined indirectly based on the distance of the magnetic angle sensors from the magnetic field source.

According to one or more embodiments, at least two of the magnetic angle sensors are on two different substrates, where a major surface of at least one substrate is perpendicular or substantially perpendicular to the rotation axis.

In an embodiment, the at least two substrates are located on the rotation axis of the shaft.

In an embodiment, the at least two substrates are attached to a single leadframe.

According to one or more embodiments, at least two of the magnetic angle sensors are on the same substrate and the major surface of this substrate is orthogonal or substantially orthogonal to the rotation axis of the shaft.

According to one or more embodiments, each of the magnetic angle sensors includes at least one out of the following group of sensor elements: an anisotropic magneto-resistor (AMR); a giant magneto-resistor (GMR); a tunneling magneto-resistor (TMR); a Vertical Hall effect device; a Hall plate; and/or a MAG-FET.

The magnetic angle sensors may be of different technologies (i.e., different types of sensors) to increase the robustness and diversity of the system. For example, one of the angle sensors may be a TMR and another other angle sensor may be an AMR or a Vertical Hall sensor. Using different technologies may mitigate the risk that both angle sensors fail under severe conditions.

According to one or more embodiments, a method is provided for determining a combined rotation angle of a shaft, where the shaft is arranged rotatably around a rotation axis and wherein a magnetic field source is connected to the shaft. The method includes: determining by a first magnetic angle sensor a first signal that represents a first angle based on a first diametric magnetic field from the magnetic field source applied to the first magnetic angle sensor; determining by a second magnetic angle sensor a second signal that represents a second angle based on a second diametric magnetic field from the magnetic field source applied to the second magnetic angle sensor; and determining the combined rotation angle based on the first signal and on the second signal.

In an embodiment, the method further includes determining by a third magnetic angle sensor a third signal that represents a third angle based on a third diametric magnetic field from the magnetic field source applied to the third magnetic angle sensor; and determining the combined rotation angle based on the first signal, the second signal and the third signal.

Also, a computer program product is provided that is directly loadable into a memory of a digital processing device, including software code portions that enable the digital processing device to perform one or more methods described herein.

Further, a computer-readable medium is provided having computer-executable instructions adapted to cause a computer system to perform one or more methods described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various example embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A magnetic angle sensor device, comprising:
   a shaft rotatable around a rotation axis;
   a magnetic arrangement coupled to the shaft, wherein the magnetic arrangement produces a magnetic field comprising a plurality of diametric magnetic fields arranged along the rotation axis, wherein each of the plurality of diametric magnetic fields has a different magnetic field gradient, and wherein the plurality of diametric magnetic fields include a field direction change such that at least a first one of the plurality of diametric magnetic fields has a first field direction and at least a second one of the plurality of diametric magnetic fields has a second field direction opposite to the first field direction;
   a first magnetic angle sensor provided in the magnetic field at a first location along the rotation axis and configured to generate a first signal that represents a first angle based on a first diametric magnetic field of the magnetic field;
   a second magnetic angle sensor provided in the magnetic field at a second location along the rotation axis and configured to generate a second signal that represents a second angle based on a second diametric magnetic field of the magnetic field; and
   a combining circuit configured to determine a combined rotation angle based on the first signal and on the second signal,
   wherein the magnetic arrangement includes a first disc-magnet and a second disc-magnet separated from the first disc-magnet along the rotation axis, thereby defining a cavity therebetween in which the magnetic field is produced,
   wherein the first magnetic angle sensor and the second magnetic angle sensor are arranged inside the cavity, and
   wherein the first disc-magnet is interposed between and coupled to the second disc-magnet and the shaft.

2. The magnetic angle sensor device according to claim 1, wherein the shaft, the first disc-magnet, and the second disc-magnet are configured to co-rotate.

3. The magnetic angle sensor device according to claim 1, wherein the magnetic arrangement is a quadrupole magnet arrangement.

4. The magnetic angle sensor device according to claim 1, wherein the first magnetic angle sensor and the second magnetic angle sensor are arranged on an extension of the rotation axis and are separated by a distance in a direction that extends along the rotation axis.

5. The magnetic angle sensor device according to claim 1, wherein the first magnetic angle sensor includes a first magnetic sensor element and a second magnetic sensor element that are laterally spaced apart from the rotation axis by less than 1 mm, and the second magnetic angle sensor includes a third magnetic sensor element and a fourth magnetic sensor element that are laterally spaced apart from the rotation axis by less than 1 mm.

6. The magnetic angle sensor device according to claim 1, wherein:
   the plurality of diametric magnetic fields includes a first portion having the first magnetic direction and a second portion having the second magnetic direction opposite to the first magnetic direction, and
   the first magnetic angle sensor and the second magnetic angle sensor are arranged in the first portion of the plurality of diametric magnetic fields and the first diametric magnetic field and the second diametric magnetic field are different field-size gradients of the first portion.

7. The magnetic angle sensor device according to claim 1, wherein:
   the plurality of diametric magnetic fields includes a first portion having the first magnetic direction and a second portion having the second magnetic direction opposite to the first magnetic direction, and the first magnetic angle sensor is arranged in the first portion of the plurality of diametric magnetic fields and the second magnetic angle sensor is arranged in the second portion of the plurality of diametric magnetic fields, wherein the first diametric magnetic field and the second diametric magnetic field are equal, but opposite, field-size gradients.

8. The magnetic angle sensor device according to claim 1, wherein:
the plurality of diametric magnetic fields includes a first portion having the first magnetic direction and a second portion having the second magnetic direction opposite to the first magnetic direction, and
the first magnetic angle sensor is arranged in the first portion of the plurality of diametric magnetic fields and the second magnetic angle sensor is arranged in the second portion of the plurality of diametric magnetic fields, wherein the first diametric magnetic field and the second diametric magnetic field are different field-size gradients.

* * * * *